(12) United States Patent
Joo et al.

(10) Patent No.: US 12,235,393 B2
(45) Date of Patent: Feb. 25, 2025

(54) METHOD AND DEVICE FOR OUTPUTTING LIGHT

(71) Applicant: LG INNOTEK CO., LTD., Seoul (KR)

(72) Inventors: Yang Hyun Joo, Seoul (KR); Kang Yeol Park, Seoul (KR); Chang Hyuck Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 1033 days.

(21) Appl. No.: 17/255,878

(22) PCT Filed: Jul. 9, 2019

(86) PCT No.: PCT/KR2019/008417
§ 371 (c)(1),
(2) Date: Dec. 23, 2020

(87) PCT Pub. No.: WO2020/013570
PCT Pub. Date: Jan. 16, 2020

(65) Prior Publication Data
US 2021/0263136 A1 Aug. 26, 2021

(30) Foreign Application Priority Data
Jul. 9, 2018 (KR) .................. 10-2018-0079370

(51) Int. Cl.
*G01S 7/484* (2006.01)
*G01S 17/42* (2006.01)
*G06V 10/141* (2022.01)
*G06V 40/16* (2022.01)

(52) U.S. Cl.
CPC .............. *G01S 7/484* (2013.01); *G01S 17/42* (2013.01); *G06V 10/141* (2022.01); *G06V 40/161* (2022.01)

(58) Field of Classification Search
None
See application file for complete search history.

(56) References Cited

U.S. PATENT DOCUMENTS

| | | | |
|---|---|---|---|
| 9,912,861 B1* | 3/2018 | Solh | G06V 10/75 |
| 2009/0273770 A1 | 11/2009 | Bauhahn et al. | |
| 2013/0222642 A1 | 8/2013 | Watanabe | |
| 2014/0169635 A1 | 6/2014 | Nishimura | |
| 2015/0138529 A1 | 5/2015 | Singer | |
| 2016/0109232 A1 | 4/2016 | Shin et al. | |
| 2017/0118459 A1* | 4/2017 | Kim | G01S 17/894 |

FOREIGN PATENT DOCUMENTS

| | | | |
|---|---|---|---|
| CN | 105607733 A | 5/2016 | |
| CN | 106060417 A | 10/2016 | |
| CN | 106612399 A | 5/2017 | |
| CN | 107451561 A | 12/2017 | |

(Continued)

*Primary Examiner* — Luke D Ratcliffe
(74) *Attorney, Agent, or Firm* — Birch, Stewart, Kolasch & Birch, LLP

(57) ABSTRACT

An embodiment provides a method and a device for outputting a light, which can output a light in a safe manner. Specifically, disclosed are a method and a device for outputting a light, which control an output light to prevent the output light from being concentrated on a specific area.

12 Claims, 10 Drawing Sheets

(56) References Cited

FOREIGN PATENT DOCUMENTS

| | | |
|---|---|---|
| JP | 7-159535 A | 6/1995 |
| JP | 2011-17666 A | 1/2011 |
| JP | 2012-185171 A | 9/2012 |
| JP | 2014-119428 A | 6/2014 |
| KR | 10-2013-0134739 A | 12/2013 |
| KR | 10-1634249 B1 | 6/2016 |
| KR | 10-2017-0048972 A | 5/2017 |

\* cited by examiner

FIG. 8

| Distance (Unit:m) | 0.1 | 0.5 | 1 | 1.5 | 3 | 5 | 810 |
|---|---|---|---|---|---|---|---|
| Area (Unit:m²) | a | b | c | d | e | f | 820 |

METHOD AND DEVICE FOR OUTPUTTING LIGHT

CROSS REFERENCE TO RELATED APPLICATIONS

This application is the National Phase of PCT International Application No. PCT/KR2019/008417, filed on Jul. 9, 2019, which claims priority under 35 U.S.C. 119(a) to Patent Application No. 10-2018-0079370, filed in the Republic of Korea on Jul. 9, 2018, all of which are hereby expressly incorporated by reference into the present application.

TECHNICAL FIELD

In the present disclosure, a method and a device for safely outputting a light according to one or more embodiments are disclosed.

BACKGROUND ART

Devices that acquire information by outputting a light and reflecting it on an object have been used in various fields. For example, from 3D cameras to distance measurement techniques, technologies for obtaining information by outputting a light are used in several ways.

For an example, Time of Flight (TOF) is a term representing the principle of measuring the distance by measuring the time difference between the time when a light is outputted and the time of reception of the light reflected and returned from an object, and since TOF technology is simple to be implemented, it is used in various fields such as aviation, shipbuilding, civil engineering, cameras, surveying, and the like.

However, since the technology for obtaining information by outputting a light as described above assumes that a light is outputted, when the present technology is used, the output light may cause an unexpected problem. Therefore, a specific method of controlling the output light for safety and the like is required in some cases.

DETAILED DESCRIPTION OF THE INVENTION

Technical Subject

The present disclosure may provide a method and a device for safely outputting a light according to one or more embodiments. Specifically, in outputting a light, a method and a device for promoting the safety of users by controlling the output light in some cases are disclosed.

The technical problem to be solved is not limited to the technical problems as described above, and various technical problems may be further included within the scope that is obvious to a person skilled in the art.

Technical Solution

A light outputting device according to the first aspect may comprise: a light source for outputting a light to an object; a receiver for receiving a light being reflected from the object; a memory for storing information on a reference area of the object recognized according to a distance between the light source and the object; and a processor configured to control the output of the light source by comparing a recognition area of the object recognized by the receiver with the reference area.

In addition, the processor may lower or turn off the output of the light source when the difference value between the recognition area and the reference area is greater than or equal to a preset value.

In addition, lowering or turning off the output of the light source may lower or block a voltage being inputted to the light source.

A light outputting device according to the second aspect may comprise: a light source for outputting a light to an object; a receiver including a plurality of pixels for receiving a light being reflected from the object; and a processor that controls an output of the light source when a light having an intensity higher than a preset intensity is detected in at least one of the plurality of pixels.

In addition, the processor may lower or turn off the output of the light source when there is a pixel in which light having intensity higher than a preset intensity is detected among the plurality of pixels.

A light outputting device according to a third aspect may comprise: a light source for outputting a light to an object; a receiver including a plurality of pixels that receives a light being reflected from the object; and a processor that controls the output of the light source by comparing the sum of the light detection intensity of pixels that recognize the object among the plurality of pixels and a preset reference intensity value.

In addition, the preset reference intensity value may be a sum of light intensity values received by each of the pixels recognizing the object according to a distance between the object and the light source.

In addition, the processor may lower or turn off the output of the light source when the sum of the light detection intensity of the pixels is equal to or greater than a preset intensity value.

In addition, information on the reference area according to the distance of the object and information on the area corresponding to each of the plurality of distances may be stored in the memory in the form of a look up table (LUT).

A method of controlling a light outputting device according to a fourth aspect may comprise the steps of: outputting a light to an object; receiving a light being reflected from the object; storing information on a reference area of the object recognized according to a distance from which the light is reflected from the object and received; and comparing the recognition area of the object recognized by the light being received with the reference area, and lowering or blocking the output of the light when the recognition area is less than or equal to a preset value than the reference area.

The fifth aspect may provide a computer-readable recording medium being recorded with a program for executing the method of the fourth aspect on a computer.

Advantageous Effects

Disclosed is a method and device for safely outputting a light by controlling an output light according to one or more embodiments.

BRIEF DESCRIPTION OF DRAWINGS

FIG. 8 is a diagram illustrating an example in which a light outputting device obtains a look-up table by recognizing the face of a user according to an embodiment.

BEST MODE

As for terms used in the embodiments, general terms that are currently widely used as possible are selected while considering functions in the present invention, but this may vary according to the intention of a person skilled in the art, precedent, the emergence of new technologies, and the like. In addition, in a specific case, there are terms arbitrarily selected by the applicant, and in this case, the meaning of the terms will be described in detail in the description part of the corresponding invention. Therefore, the terms used in the present invention should be defined based on the meaning of the term and the overall contents of the present invention, not a simple name of the term.

When a part of the specification is said to "comprise" a certain element, it means that other elements may be further included rather than excluding other elements unless otherwise stated. In addition, the terms " . . . unit", " . . . module", and the like refers to a unit that processes at least one function or operation, which may be implemented as hardware or software, or a combination of hardware and software.

Hereinafter, embodiments of the present invention will be described in detail with reference to the accompanying drawings so that a person skill in the art may easily implement the present invention. However, the present invention may be implemented in various different forms and is not limited to the embodiments described herein.

Hereinafter, embodiments of the present invention will be described in detail with reference to the drawings.

Figure 1:
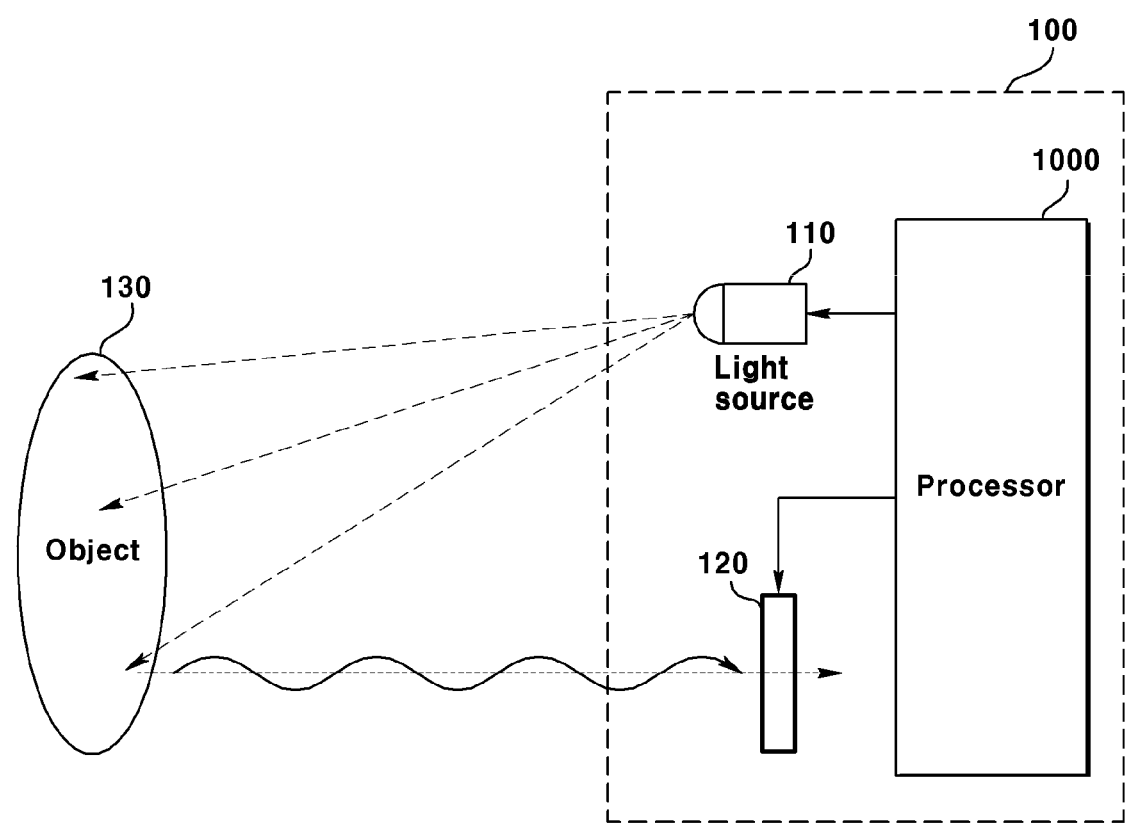
FIG. 1 is a block diagram illustrating a configuration and operation of a light outputting device according to an embodiment.

FIG. 1 is a block diagram illustrating a configuration and operation of a light outputting device 100 according to an embodiment.

As illustrated in FIG. 1, a light outputting device 100 may include a light source 110, a processor 1000, and a receiver 120.

However, it can be understood by a person skill in the art that general-purpose components other than the components illustrated in FIG. 1 may be further included in a light outputting device 100. For example, the light outputting device 100 may further include a diffuser through which a light being outputted from a light source is transmitted or a memory connected to the processor 1000. Or, according to another embodiment, it may be understood by a person skilled in the art that some of the components illustrated in FIG. 1 may be omitted.

The light source 110 according to an embodiment may output an output light. The output light is a light being outputted from the light source 110 and may have a wavelength within a preset range.

The output light may mean a light being outputted from the light source 110, and may be simply described as "light" in some cases.

The light source 110 is, for example, a light-emitting diode (LED) or a laser diode (LD) capable of emitting a light having an infrared wavelength, and a light having a near-infrared (NIR) wavelength of about 850 nm, which is invisible to the human eye for safety, but the wavelength band and the type of light source are not limited. For example, the wavelength of the output light being outputted from the light source 110 may be included in the visible region or the ultraviolet region.

The light source 110 may output an output light by performing amplitude modulation or phase modulation, for example, according to a control signal received from the processor 1000. The output light being outputted from the light source 110 to an object 130 according to the control signal of the processor 1000 may have a form of a periodic continuous function having a predetermined period. For example, the output light may have a specially defined waveform such as a sine wave, a ramp wave, a square wave, and a pulse wave, but may have a general shape that is not defined.

The receiver 120 may receive a light reflected from the object 130. The light outputting device 100 may acquire various information through the received light received by the receiver 120.

The light outputting device 100 according to an embodiment may acquire information on the object 130 through a received light. For example, the processor 1000 may obtain various information on the object, such as the shape, size, color, and the like of the object 130. In addition, the light outputting device 100 may be corresponding to a preset shape to the shape of the object 130 by recognizing the shape of the object 130. For example, the light outputting device 100 may perform facial recognition through a received light. The light outputting device may acquire various information about a face by performing facial recognition. For example, the light outputting device may determine a portion of the object 130 corresponding to the face, and obtain information on the size, brightness, and color of the portion corresponding to the face, as well as information on a distance to the face.

The receiver 120 may distinguish a received light obtained by reflecting an output light being outputted from the light source 110 to the object 130 among various lights entering the receiver 120. For example, when the light source 110 outputs an output light in the range of 750 nm to 950 nm, the receiver 120 may selectively acquire light in the range of 750 nm to 950 nm through filtering. In addition, the receiver 120 may acquire accurate information on the object 130 by selectively obtaining received light corresponding to the output light.

The processor 1000 according to an embodiment may control the light source 110 and/or the receiver 120 based on information acquired through the received light being received by the receiver 120.

The processor 1000 may determine a degree to which the output light is concentrated on a specific area of the object 130 through the received light being received by the receiver 120. For example, the processor 1000 may determine the face area of a user, compare the determined face area with a reference area, and determine whether the output light is concentrated on the face of the user.

The processor 1000 according to an embodiment determines a look up table (LUT) representing a reference area for the face of a user according to the distance, and the reference area of the face determined according to the distance from the light source 110 to the face is obtained from the LUT, and the output of the light source 110 can be controlled according to a result of comparing the recognition area of the face recognized by the output light at the receiver 120 and the reference area.

Information on the reference area according to the distance of the object 130 and information on the area corresponding to each of the plurality of distances may be stored in a memory in the form of a look-up table (LUT).

The processor 1000 may determine a degree to which the output light is concentrated on a specific area of the object 130 through the received light being received by the receiver 120. The processor 1000 obtains received light being received from a plurality of pixels included in the receiver 120 for each pixel, determines a specific area (e.g., face area) of the object 130, and determines the intensity of the received light acquired from the specific area of the object 130, and may determine whether the intensity of the received light acquired from the specific area of the object 130 is equal to or greater than a preset value. The face area may mean an area representing the face of the user out of the total area.

The processor 1000 according to an embodiment determines pixels corresponding to a face area among a plurality of pixels included in the receiver 120, and an energy value of received light per pixel among pixels of the receiver 120 included in the face area. When there is a pixel equal to or greater than this preset value, the current state may be determined as an abnormal state. As another example, the processor 1000 determines pixels corresponding to the face area among a plurality of pixels included in the receiver 120, and the energy value of the received light per pixel among the pixels of the receiver 120 included in the face area, and when there are more than a preset number (e.g., two) of pixels equal to or larger than a preset value, the current state may be determined as an abnormal state.

The processor 1000 according to an embodiment may determine the current state as an abnormal state when the sum of the energy values of the received light received by the pixels of the receiver 120 included in the face area is equal to or greater than a preset value.

When the current state is determined to be an abnormal state, the processor 1000 may transmit a control signal to the light source 110 to control the intensity of the output light being outputted from the light source 110 to be less than or equal to a preset value.

For example, when the current state is determined to be an abnormal state, the processor 1000 may turn off the output of the light source 110 so that the output light is not outputted from the light source 110.

As another example, when the current state is determined to be an abnormal state, the processor 1000 may control the output of the light source 110 so that the intensity of the output light being outputted from the light source 110 is equal to or less than a preset value.

As another example, when the current state is determined to be an abnormal state, the processor 1000 may control the output light being outputted from the light source 110 according to the current state. For example, if there is a pixel in which the energy value of the received light per pixel is greater than or equal to the first value among pixels of the receiver 120 included in the face area, the processor 1000 may turn off the output of the light source 110 so that the output light is not outputted from the light source 110, and when among the pixels of the receiver 120 included in the face area, there is a pixel in which the energy value of the received light per pixel is greater than or equal to the second value (a value smaller than the first value) and less than or equal to the first value, the processor 1000 may control the output of the light source 110 so that the intensity of the output light being outputted from the light source 110 is equal to or less than a preset value.

As another example, when the current state is determined to be an abnormal state, the processor 1000 may control the output light being outputted from the light source 110 according to the sum of the energy values of the received light received by the pixels of the receiver 120 included in the face area. For example, when the sum of the energy values of the received light received by the pixels of the receiver 120 included in the face area is equal to or greater than a first value, the processor 1000 may turned off the output of the light source so that the output light is not outputted from the light source 110, and when the sum of the energy values of the received light received by the pixels of the receiver 120 included in the face area is greater than or equal to the second value (a value smaller than the first value) and less than or equal to the first value, the processor 1000 may control the output of the light source 110 so that the intensity of the output light being outputted from the light source 110 is equal to or less than a preset value.

The processor 1000 may determine whether or not the output light is concentrated regardless of a specific area of the object 130, and the current state may be determined as an abnormal state when the concentration of the output light is sensed. The area to which the output light is irradiated is determined according to the distance between the light source 110 and the object 130. As the distance between the light source 110 and the object 130 increases, the area to which the output light is irradiated increases, and as the distance between the light source 110 and the object 130 increases, the area to which the output light is irradiated decreases. The processor 1000 may determine the distance between the current light source 110 and the object 130, and determines the total reference area in which the output light is expected to be irradiated according to the distance between the current light source 110 and the object 130. The processor 1000 may determine a total recognition area in which the output light is recognized through the output light received from the receiver 120, and compare the total recognition area with the total reference area to determine whether there is an abnormal state.

Since the total recognition area is the total area recognized by the output light, if the total recognition area is smaller than the total reference area, it may mean that the output light is concentrated. Therefore, when the total recognition area is smaller than the total reference area, the processor 1000 may control the output light being outputted from the light source 110. For example, when the total recognition area is smaller than the total reference area, the processor

1000 may turn off the light source 110 to stop the output of the output light. As another example, when the total recognition area is smaller than the total reference area, the processor 1000 may reduce the intensity of the light being outputted from the light source 110 to be less than or equal to a preset value.

There may be various methods in which the processor 1000 compares the total recognition area, which is the area recognized by the output light, with the total reference area, and controls the output of the light source 110 according to the result of comparison.

As described above, the processor 1000 according to an embodiment may control the output light being outputted from the light source 110 when the total recognition area is smaller than the total reference area.

The processor 1000 according to an embodiment may control the output of the light source 110 when the total recognition area is smaller than a preset ratio of the total reference area (e.g., 80% or less of the total reference area). For example, when the total recognition area is smaller than a preset ratio of the total reference area, the processor 1000 may turn off the light source 110 to stop the output of the output light. As another example, when the total recognition area is less than a preset ratio of the total reference area, the processor 1000 may reduce the intensity of output light being outputted from the light source 110 to a preset value or less.

The processor 1000 according to an embodiment may control the output of the light source 110 based on the size of the total recognition area when the total recognition area is smaller than a preset ratio of the total reference area (e.g., 90% or less of the total reference area). For example, when the total recognition area is smaller than a preset ratio of the total reference area, the processor 1000 may control the intensity of the output light to be inversely proportional to the size of the total recognition area. As another example, when the total recognition area is determined as a first section (e.g., 90% to 50% of the total reference area), the processor 1000 controls the intensity of the output light to be inversely proportional to the size of the total recognition area, and when the total recognition area is determined as a second section (e.g., 50% to 0% of the total reference area), the processor turns off the light source 110 so that the output light is not outputted.

According to an embodiment, the light source 110 may output light to the object 130 and the receiver 120 may receive the light reflected from the object. Information on the reference area of the object 130 which is recognized according to the distance between the light source 110 and the object 130 may be stored in a memory (not shown).

The processor 1000 may control the output of the light source 110 by comparing the recognition area of the object 130 recognized by the receiver 120 with a reference area. In more detail, the processor 1000 may lower or turn off the output of the light source 110 when the difference between the recognition area and the reference area is greater than or equal to a preset value. Here, lowering or turning off the output of the light source 110 may mean lowering or blocking a voltage being inputted to the light source 110.

According to an embodiment, the light source 110 may output light to the object 130, and the receiver 120 may receive the light reflected from the object. The receiver 120 may include a plurality of pixels that receive light reflected from the object 130. When light having intensity higher than the preset intensity is detected in at least one of the plurality of pixels, the processor 1000 may control the output of the light source 110. Specifically, the processor 1000 may lower or turn off the output of the light source 110 when there is a pixel in which light having intensity higher than a preset intensity is detected among a plurality of pixels.

According to an embodiment, the light source 110 may output light to the object 130, and the receiver 120 may include a plurality of pixels to receive light reflected from the object 130.

The processor 1000 may control the output of the light source 110 by comparing the sum of the light detection intensity of pixels that recognize the object 130 among the plurality of pixels with a preset reference intensity value. In more detail, the processor 1000 may lower or turn off the output of the light source 110 when the sum of the light detection intensity is greater than a preset reference intensity value. Or, the processor 1000 may lower or turn off the output of the light source 110 when the sum of the light detection intensity of the pixels is equal to or greater than a preset intensity value.

The preset reference intensity value may be a sum of light intensity values received by each of the pixels recognizing the object 110 according to the distance between the object 130 and the light source 110.

According to an embodiment, the light outputting device 100 outputs light to the object 130, receives the light reflected from the object 130, and stores information on the reference area of the object 130 recognized according to a distance between the object 130 and the point at which the reflected light is received, and may lower or block the output of light when the recognition area is less than or equal to a preset value by comparing the reference area and the recognition area of the object 130 being recognized by the received light.

Figure 2:
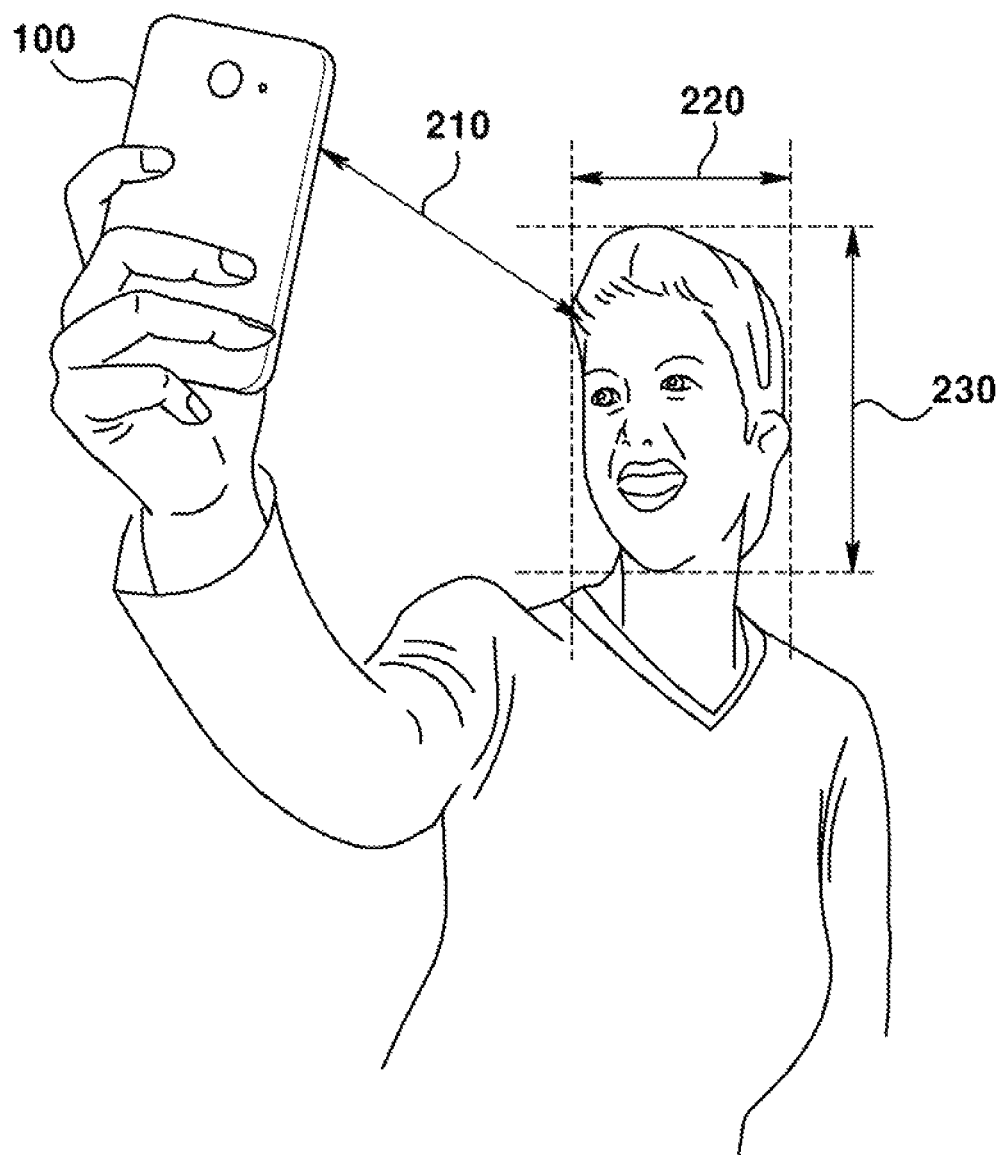
FIG. 2 is a diagram illustrating an example in which a light outputting device according to an embodiment recognizes a user.

FIG. 2 is a diagram illustrating an example in which a light outputting device 100 according to an embodiment recognizes a user.

The light outputting device 100 according to an embodiment may recognize a user. For example, the light outputting device 100 may recognize a specific body part (e.g., a face) of a user. The light outputting device 100 may determine an area corresponding to the face of a user among the total area of the acquired image.

The light outputting device 100 according to an embodiment may determine a reference for an area of a specific body part (e.g., a face) of a user.

The light outputting device 100 according to an embodiment may determine a reference area of a face determined based on a distance from the light source 110 or the light outputting device 100 to the face. The reference area of the face represents the reference of the area of the face of a user according to the distance. The light outputting device 100 may determine a reference area according to a distance through one or more photographing. For example, in the reference area determination mode for determining the reference area, the light outputting device 100 uses the determined face area of a user and the distance between the light outputting device 100 and the face when the face area of user is determined, and may determine a reference area, which is a predicted value of the face area of a user according to the distance. For example, if the expected face area of a user is a $m^2$ when the distance from the light source 110 to the face is 0.1 m, a $m^2$ is the reference area of the face for the distance 0.1 m, and when the expected face area of the user when the distance from the light source 110 to the face is 1 m is c $m^2$, c $m^2$ may be the reference area of the face for the distance 1 m.

The light outputting device 100 according to an embodiment may determine an area of a specific body part (e.g., a face) of the user. The recognition area, which is an area of the face recognized by the light outputting device 100 by the output light, may vary according to a distance 210 between the light outputting device 100 and the face. For example, as the distance 210 between the light outputting device 100 and the face increases, the recognition area decreases, and as the distance 210 between the light outputting device 100 and the face decreases, the recognition area may be increased.

When determining the area of the face, the light outputting device 100 according to an embodiment may use the number of pixels corresponding to the area of the face. The light outputting device 100 may determine the face area according to the number of pixels corresponding to the face area among a plurality of pixels included in the receiver 120. The light outputting device 100 may determine the area of the face using a ratio occupied by the area corresponding to the face of the total area of the image acquired through the received light.

When determining the area of the face, the light outputting device 100 according to an embodiment may use the horizontal length 220 of the face. The light outputting device 100 may determine the area of the face according to the number of pixels corresponding to the horizontal length 220 of the face among a plurality of pixels included in the receiver 120. The light outputting device 100 may determine the area of the face using a ratio occupied by the horizontal length 220 of the face among the total horizontal length of the image acquired through the received light.

When determining the area of the face, the light outputting device 100 according to an embodiment may use the vertical length 230 of the face. The light outputting device 100 may determine the area of the face according to the number of pixels corresponding to the vertical length 230 of the face among a plurality of pixels included in the receiver 120. The light outputting device 100 may determine the area of the face using a ratio occupied by the vertical length 230 of the face among the total vertical length of the image acquired through the received light.

Figure 3:
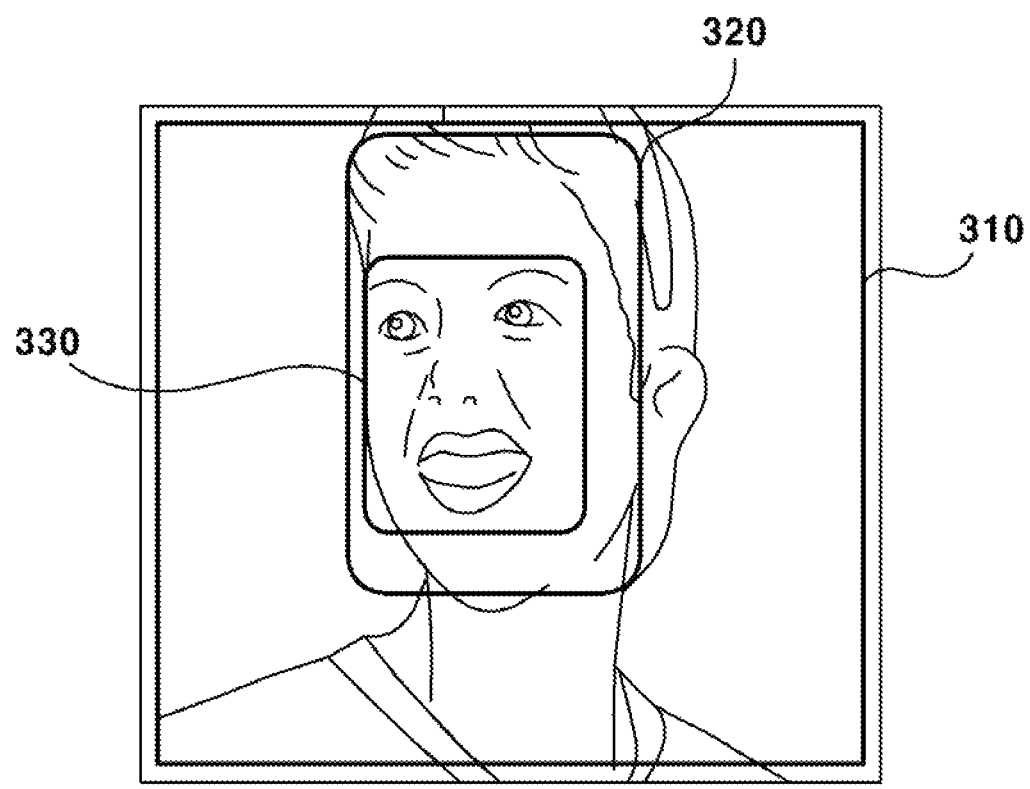
FIG. 3 is a diagram illustrating an example in which a light outputting device operates by recognizing the face of a user, according to an embodiment.

FIG. 3 is a diagram illustrating an example in which a light outputting device 100 is operated by recognizing the face of a user according to an embodiment.

The recognition area according to an embodiment may be an area in which the face of a user is recognized by an output light. When the output light is irradiated in a sufficiently wide range, the recognition area may be a total face area 320. However, when the output light is concentrated, the recognition area may be a partial area of the total face area 320. For example, the recognition area may be between the total face area 320 and a minimum recognizable area 330, or may be smaller than the minimum recognizable area 330 in some cases. However, in general, the recognition area may not be larger than the total face area 320.

The minimum recognizable area 330 according to an embodiment may mean a minimum area for recognizing the face of a user. When there is information on the minimum recognizable area 330, the light outputting device 100 may determine whether it is a face. In addition, the area once recognized as a face can be continuously recognized as a face. In addition, when determining whether the light outputting device 100 is a face, other light (e.g., natural light) may be used as well as an output light being outputted from the light source 110.

The light outputting device 100 according to an embodiment may determine a reference area of a face determined based on a distance from the light source 110 or the light outputting device 100 to the face. For example, if the expected face area of a user is a m$^2$ when the distance from the light source 110 to the face is 0.1 m, a m$^2$ is the reference area of the face for the distance 0.1 m, and if the expected face area of the user is c m$^2$ when the distance from the light source 110 to the face is 1 m, c m$^2$ may be the reference area of the face for the distance 1 m. Such a reference area may be displayed or stored as a look up table (LUT).

The reference area is an area that becomes a reference, and may be predetermined as total or part of the actual face area. For example, the reference area may be an area corresponding to the total face area 320 or an area corresponding to the minimum recognizable area 330. When the reference area corresponds to the total face area 320, the light outputting device 100 may determine the total face area recognized according to the distance as the reference area when determining the reference area. When the reference area corresponds to the minimum recognizable area 330, when determining the reference area, the light outputting device 100 may determine the minimum recognizable area recognized according to the distance as the reference area.

The reference area once determined is stored in the memory, and if necessary, the processor 1000 may determine the reference area according to the distance using the LUT stored in the memory.

The processor 1000 may compare the recognition area, which is an area of the face recognized by the output light, with a reference area, and control the output of the light source 110 according to the result of the comparison.

Since the recognition area is an area of the face recognized by the output light, if the recognition area is smaller than the reference area, it may mean that the output light is concentrated within the face area. Therefore, when the recognition area is smaller than the reference area, the processor 1000 may control the output light being outputted from the light source 110. For example, when the recognition area is smaller than the reference area, the processor 1000 may turn off the light source 110 to stop the output of the output light. As another example, when the recognition area is smaller than the reference area, the processor 1000 may reduce the intensity of the output light being outputted from the light source 110 to a preset value or less.

There may be various ways in which the processor 1000 compares the recognition area of the face recognized by the output light with the reference area and controls the output of the light source 110 according to the result of the comparison.

As described above, the processor 1000 according to an embodiment may control output light being outputted from the light source 110 when the recognition area is smaller than the reference area.

The processor 1000 according to an embodiment may control the output of the light source 110 when the recognition area is smaller than a preset ratio of the reference area (e.g., 80% or less of the reference area). For example, when the recognition area is less than a preset ratio of the reference area, the processor 1000 may turn off the light source 110 to stop the output of the output light. As another example, when the recognition area is smaller than a preset ratio of the reference area, the processor 1000 may reduce the intensity of the output light being outputted from the light source 110 to less than or equal to the preset value.

The processor 1000 according to an embodiment may control the output of the light source 110 based on the size of the recognition area when the recognition area is smaller than a preset ratio of the reference area (e.g., 90% or less of the reference area). For example, when the recognition area is smaller than a preset ratio of the reference area, the processor 1000 may control the intensity of the output light to be inversely proportional to the size of the recognition area. As another example, when the recognition area is determined as a first section (e.g., 90% to 50% of the reference area), the processor 1000 controls the intensity of the output light to be inversely proportional to the size of the recognition area, and the recognition area is determined as a second section (e.g., 50% to 0% of the reference area), the processor 1000 may turn off the light source 110 so that the output light is not outputted.

Figure 4:
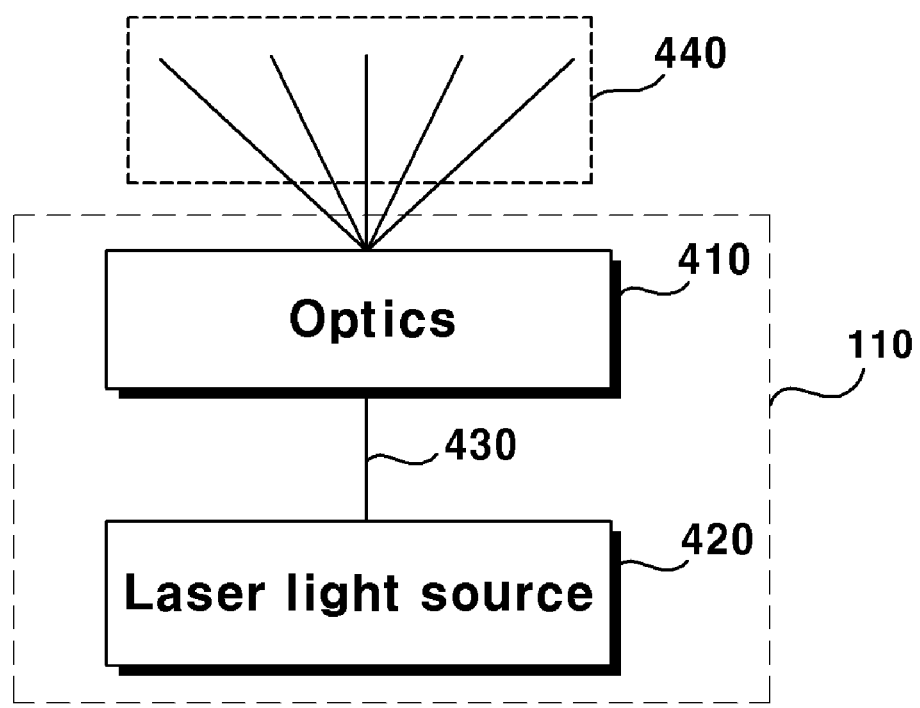
FIG. 4 is a diagram illustrating an example of a light source included in a light outputting device according to an embodiment.

FIG. 4 is a diagram illustrating an example of a light source 110 included in the light outputting device 100 according to an embodiment.

The light source 110 may include a laser light source 420 and an optical device 410. The optical device 410 may generically refer to various devices related to optics, such as a lens, a diffuser, a glass, and the like.

According to an embodiment, when the light source 110 includes a laser light source 420, a laser 430 being outputted from the laser light source 420 may be applied to the optical device 410. The optical device 410 may disperse the applied laser 430 and output it as an output light 440. Since the laser 430 in which the energy was initially concentrated is distributed and outputted by the optical device 410, if the laser 430 cannot be dispersed in the optical device 410, the output light 440 is not dispersed and may be concentrated. Or, even though the laser 430 is dispersed in the optical device 410, when the dispersed laser is concentrated again, the energy density of the output light 440 may increase.

Figure 5:
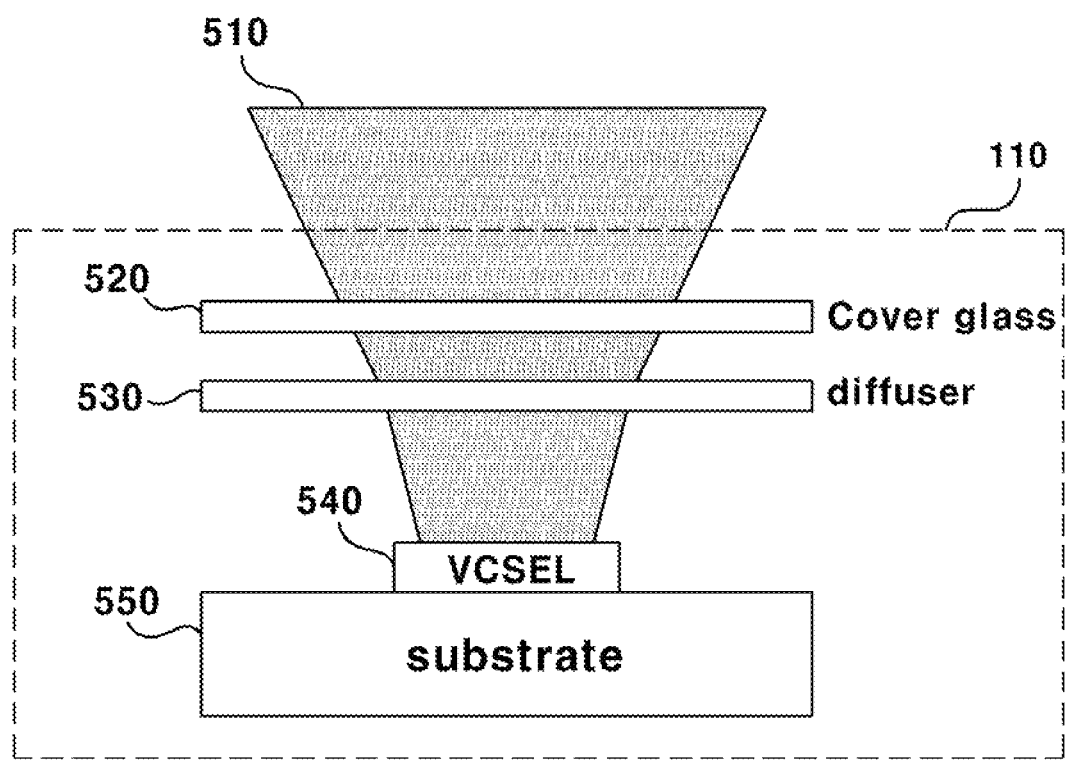
FIG. 5 is a diagram illustrating an example of outputting a light from a light source of a light outputting device according to an embodiment.

FIG. 5 is a diagram illustrating an example of outputting an output light 510 from a light source 110 of the light outputting device 100 according to an embodiment.

According to an embodiment, the light source 110 may include a substrate 550, a VCSEL 540, a diffuser 530, and a cover glass 520.

The laser being outputted from the VCSEL 540 located on the substrate 550 may be distributed and outputted while passing through the diffuser 530. In addition, the output light 510 may pass through the cover glass 520 and be outputted to the outside of the light source 110.

The cover glass 520 may be located outside the light source 110 to separate the light source 110 and the diffuser 530 from the outside.

Since the laser to which the energy is initially concentrated is distributed and outputted by the diffuser 530, when the laser cannot be dispersed by the diffuser 530, the output light 510 may be concentrated without being dispersed. Or, even though dispersion is performed by the diffuser 530, when the dispersed laser is concentrated again, the energy density of the output light 510 may be increased.

Figure 6:
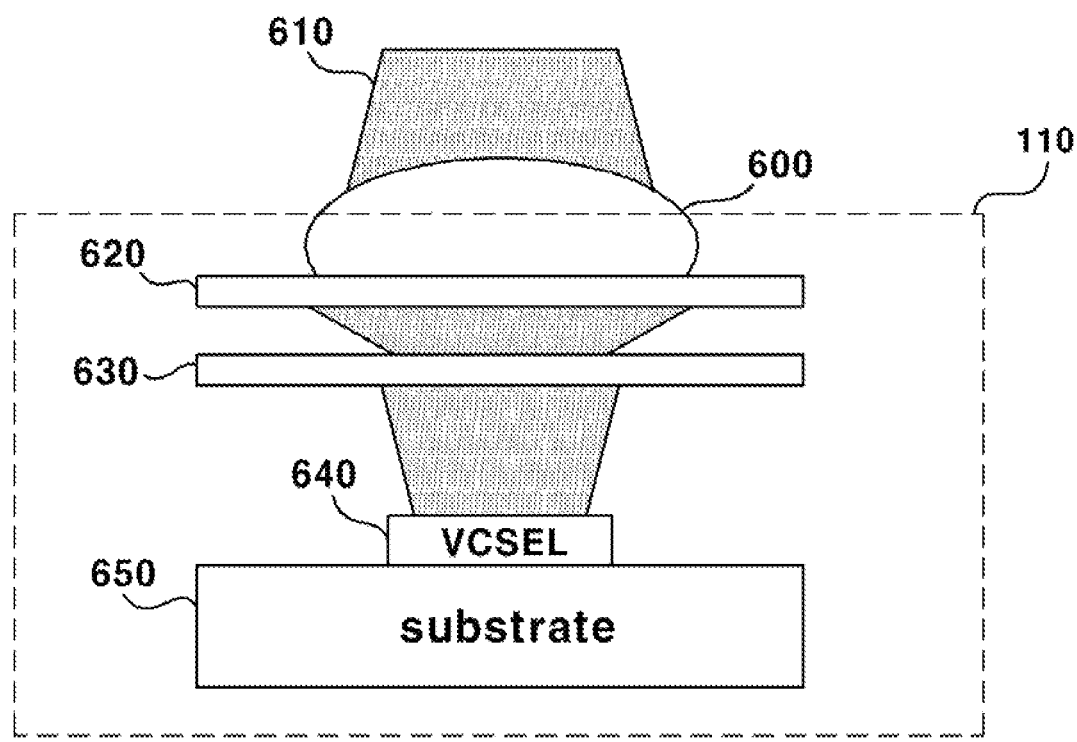
FIG. 6 is a diagram illustrating an example in which a light outputting device controls an output light when the output light is concentrated according to a foreign substance according to an embodiment.

FIG. 6 is a diagram illustrating an example in which the light outputting device 100 controls output light when an output light 610 is concentrated according to a foreign substance according to an embodiment.

According to an embodiment, the light source 110 may include a substrate 650, a VCSEL 640, a diffuser 630, and a cover glass 620.

The laser being outputted from the VCSEL 640 located on the substrate 650 may be distributed and outputted while passing through the diffuser 630. In addition, the output light 610 may pass through the cover glass 620 and outputted to the outside of the light source 110.

The cover glass 620 is located outside the light source 110 to separate the light source 110 and the diffuser 630 from the outside.

However, when there is a foreign material 600, the output light 610 may be concentrated again by the foreign material 600 after being primarily dispersed by the diffuser 630.

When the energy density of the output light 610 is increased as described above, the light outputting device 100 may control the output light. For example, when a high energy density of the output light 610 is detected on the face of a user, the light outputting device 100 turns off the light source 110 so that the output light 610 is not outputted or may control the light source 110 so that the intensity of the output light 610 is less than or equal to a preset value.

Figure 7:
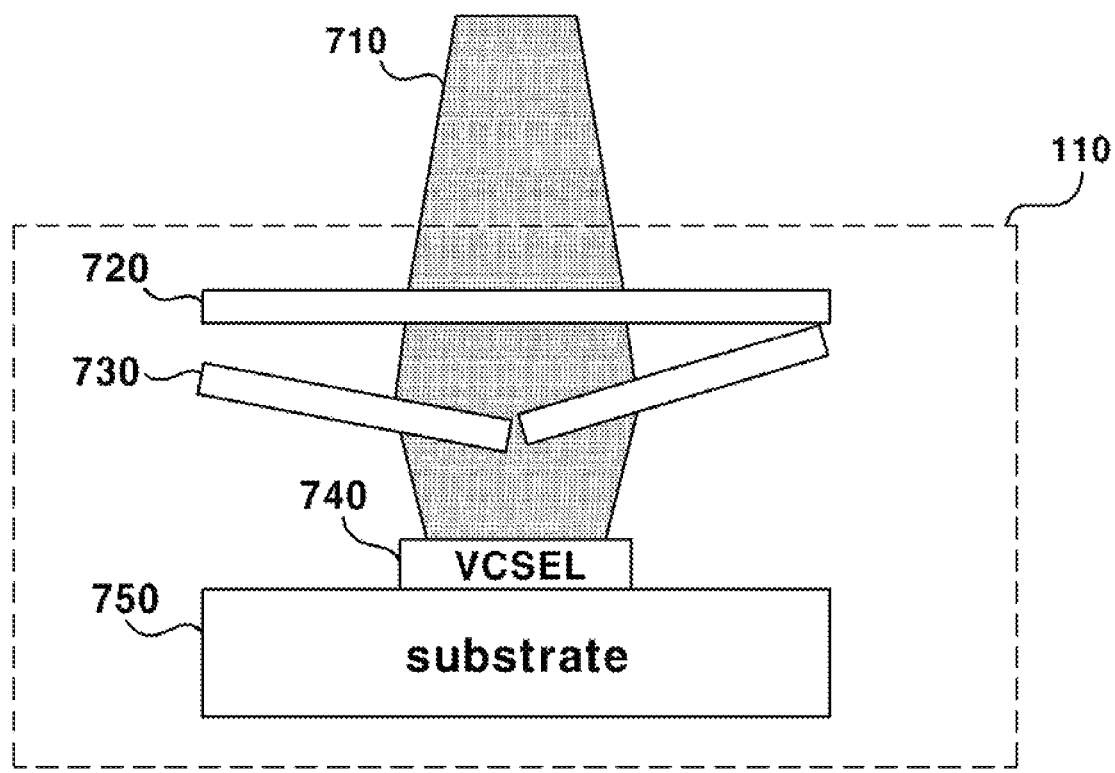
FIG. 7 is a diagram illustrating an example of controlling an output light when the output light is concentrated according to damages in some parts of a light outputting device according to an embodiment.

FIG. 7 is a diagram illustrating an example according to an embodiment in which the light outputting device 100 controls an output light when the output light 710 is concentrated due to the damages in some parts.

According to an embodiment, the light source 110 may include a substrate 750, a VCSEL 740, a diffuser 730, and a cover glass 720.

The laser being outputted from the VCSEL 740 located on the substrate 750 may be distributed and outputted while passing through the diffuser 730. It may pass through the cover glass 720 and may be outputted to the outside of the light source 110.

The cover glass 720 is located outside the light source 110 to separate the light source 110 and the diffuser 730 from the outside.

However, when there is damage in the diffuser 730, the output light 710 may be outputted without being dispersed by the diffuser 730. Or rather, the diffuser 730 may output the laser to be concentrated more.

When the energy density of the output light 710 is increased as described above, the light outputting device 100 may control the output light. For example, when a high energy density of the output light 710 is detected on the face of a user, the light outputting device 100 may turn off the light source 110 so that the output light 710 is not outputted or may control the light source 110 so that the intensity of the output light 710 is less than or equal to a preset value.

In addition to the cases disclosed in FIGS. 6 and 7, there are various cases in which the light outputting device 100 operates and are not limited to the above-described embodiments. For example, the light outputting device 100 may control (e.g., turn off or reduce) the output light being outputted when the light is concentrated in the cases where the cover glass 620 is broken, a foreign material is generated inside the cover glass 620, a foreign material is generated inside the diffuser 530, and the like.

FIG. 8 is a diagram illustrating an example according to an embodiment in which the light outputting device 100 obtains a lookup table by recognizing the face of a user.

A reference area 820 according to an embodiment may represent an area of a face expected according to a distance from the light source 110 or the light outputting device 100 to the face. According to an embodiment, the light outputting device 100 may determine the reference area 820 according to a distance 810 from the light source 110 to the face through one or more photographing. For example, when the area of the face is determined as c $m^2$ when the distance 810 from the light source 110 to the face is 1 m, then even in the case of a distance 810 from the light source 110 to the face is 0.1 m, 0.5 m, 1.5 m, 3 m, 5 m, or the like, the light outputting device 100 can determine the reference area 820 corresponding thereto using a preset algorithm or the like.

Figure 9:
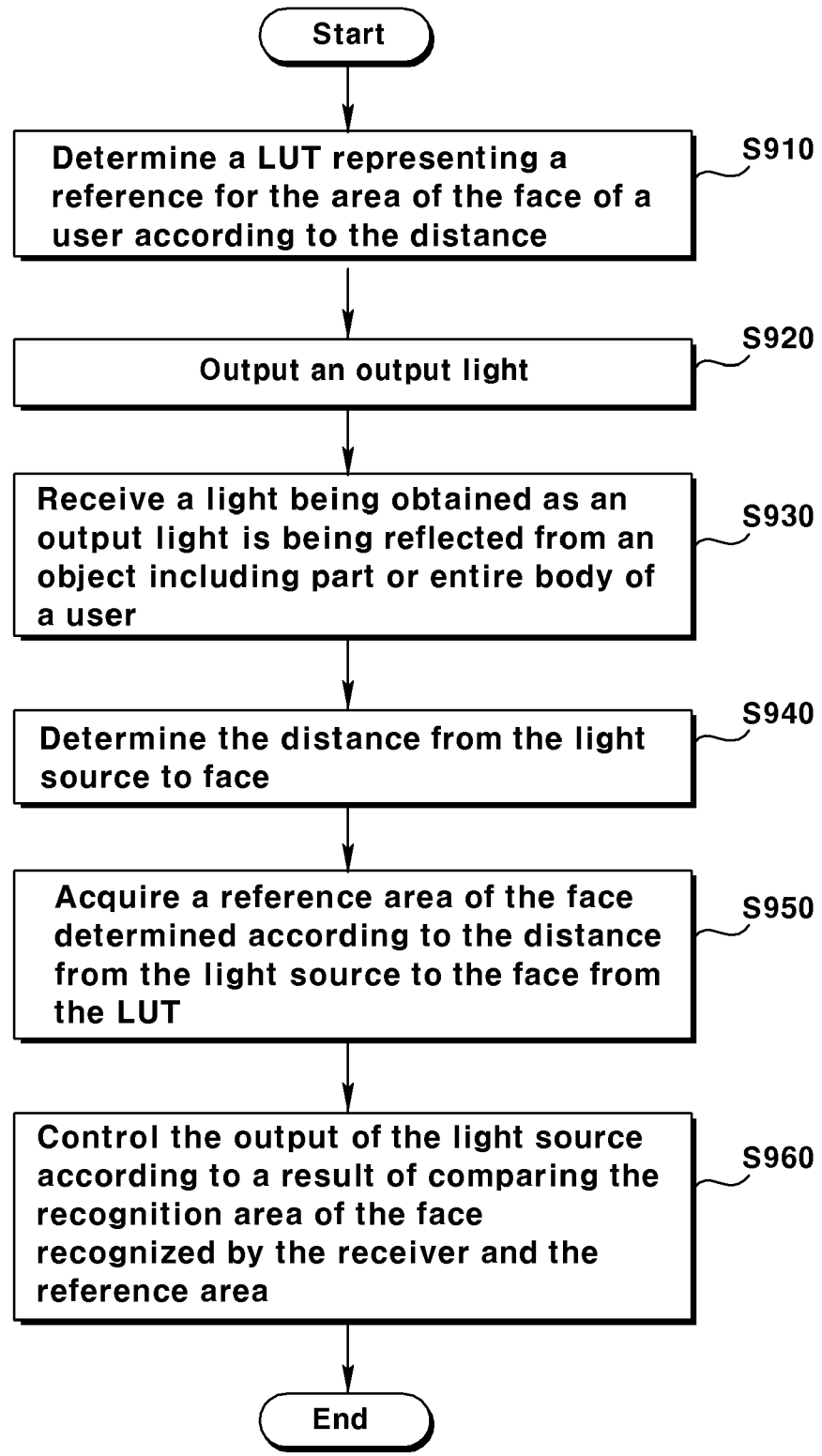
FIG. 9 is a flowchart illustrating an example in which a light outputting device controls an output of a light source according to face area recognition, according to an embodiment.

FIG. 9 is a flowchart illustrating an example of controlling an output of the light source 110 as the light outputting device 100 recognizes a face area according to an embodiment.

In step S910, the light outputting device 100 according to an embodiment determines a LUT representing a reference for the area of the face of a user according to the distance.

The reference area according to an embodiment may represent an area of the face expected according to a distance from the light source 110 or the light outputting device 100 to the face. According to an embodiment, the light outputting device 100 may determine a reference area according to a distance from the light source 110 to the face through one or more photographing. For example, when the distance from the light source 110 to the face is 0.5 m and the area of the face is determined as b m², then even in the case of a distance from the light source 110 to the face is 0.1 m, 1 m 1.5 m, 3 m, 5 m, or the like, the light outputting device 100 can determine the reference area corresponding thereto using a preset algorithm or the like.

Also, the light outputting device 100 may store a reference area according to a distance in the form of an LUT.

The light outputting device 100 according to an embodiment may determine a reference for an area of a specific body part (e.g., a face) of a user.

The light outputting device 100 according to an embodiment may determine a reference area of a face determined based on a distance from the light source 110 or the light outputting device 100 to the face. The reference area of the face represents the reference of the area of the face of a user according to the distance. The light outputting device 100 may determine a reference area according to a distance through one or more photographing. For example, in the reference area determination mode for determining the reference area, the light outputting device 100 uses the determined face area of the user and the distance between the light outputting device 100 and the face when the face area of a user is determined, and a reference area, which is a predicted value of the face area of a user according to the distance, may be determined. For example, if the expected face area of a user is a m² when the distance from the light source 110 to the face is 0.1 m, a m² is the reference area of the face for the distance 0.1 m, and when the expected face area of the user when the distance from the light source 110 to the face is 1 m is c m², c m² may be the reference area of the face for the distance 0.1 m.

In step S920, the light outputting device 100 according to an embodiment outputs a light.

The light outputting device 100 may output a light by performing amplitude modulation or phase modulation, for example. The output light being outputted to the object 130 may have a form of a periodic continuous function having a predetermined period. For example, the output light may have a specially defined waveform such as a sine wave, a ramp wave, a square wave, a pulse wave, and the like but may have a general shape that is not defined.

In step S930, the light outputting device 100 according to an embodiment receives a light being obtained as an output light is being reflected from an object including part or entire body of a user.

The light outputting device 100 may receive light reflected from the object 130. The light outputting device 100 may obtain various information through the light received by the light outputting device 100.

The light outputting device 100 may distinguish received light obtained as an output light being outputted from the light outputting device 100 among the plurality of lights is reflected from the object 130 and flowing into the receiver 120. For example, when the light outputting device 100 outputs a light in the range of 750 nm to 950 nm, the light outputting device 100 may selectively acquire light in the range of 750 nm to 950 nm through filtering. In addition, the light outputting device 100 may obtain accurate information on the object 130 by selectively obtaining received light corresponding to the output light.

In step S940, the light outputting device 100 according to an embodiment determines a distance from the light outputting device 100 to the face.

The light outputting device 100 may determine a distance from the light outputting device 100 to the face through the received light. For example, the light outputting device 100 may determine a distance from the light outputting device 100 to the face through the TOF method.

In step S950, the light outputting device 100 according to an embodiment acquires a reference area of the face determined according to the distance from the light source to the face from the LUT in step S940.

The light outputting device 100 according to an embodiment may determine a reference area of the face corresponding to the distance from the current light outputting device 100 to the face by matching the distance determined in step S940 to the LUT received in step S910.

In step S960, the light outputting device 100 according to an embodiment controls the output of the light source according to a result of comparing the recognition area of the face recognized by the receiver and the reference area.

The light outputting device 100 according to an embodiment may determine an area of a specific body part (e.g., a face) of the user. The recognition area, which is an area of the face recognized by the light outputting device 100 by the output light, may vary according to a distance between the light outputting device 100 and the face. For example, as the distance between the light outputting device 100 and the face increases, the recognition area may decrease, and as the distance between the light outputting device 100 and the face decreases, the recognition area may increase.

The light outputting device 100 may compare a recognition area, which is an area of a face recognized by the output light, with a reference area, and control the output of the light outputting device 100 according to the result of the comparison.

Since the recognition area is an area of the face recognized by the output light, if the recognition area is smaller than the reference area, it may mean that the output light is concentrated within the face area. Accordingly, when the recognition area is smaller than the reference area, the light outputting device 100 may control the output light being outputted from the light source 110. For example, when the recognition area is smaller than the reference area, the light outputting device 100 may stop outputting the light. As another example, when the recognition area is smaller than the reference area, the light outputting device 100 may reduce the intensity of the output light below a preset value.

There may be various methods in which the light outputting device 100 compares the recognition area, which is the area of the face recognized by the output light, with a reference area, and controls the output of the output light according to the result of the comparison.

The light outputting device 100 according to an embodiment may control output light being outputted from the light outputting device 100 when the recognition area is smaller than the reference area as described above.

The light outputting device 100 according to an embodiment may control the output of the output light when the recognition area is smaller than a preset ratio of the reference area (e.g., 80% or less of the reference area). For example, when the recognition area is smaller than a preset ratio of the reference area, the light outputting device 100 may stop outputting the output light. As another example, when the recognition area is smaller than a preset ratio of the reference area, the light outputting device 100 may reduce the intensity of the output light to a preset value or less.

The light outputting device 100 according to an embodiment may control the output of the output light based on the size of the recognition area when the recognition area is smaller than a preset ratio of the reference area (e.g., 90% or less of the reference area). For example, when the recognition area is smaller than a preset ratio of the reference area, the light outputting device 100 may control the intensity of the output light to be inversely proportional to the size of the recognition area. As another example, when the recognition area is determined as a first section (e.g., 90% to 50% of the reference area), the light outputting device 100 controls the intensity of the output light to be inversely proportional to the size of the recognition area, and when the recognition area is determined as a second section (e.g., 50% to 0% of the reference area), the light outputting device 100 may turn off the output of the output light so that the output light is not outputted.

Figure 10:
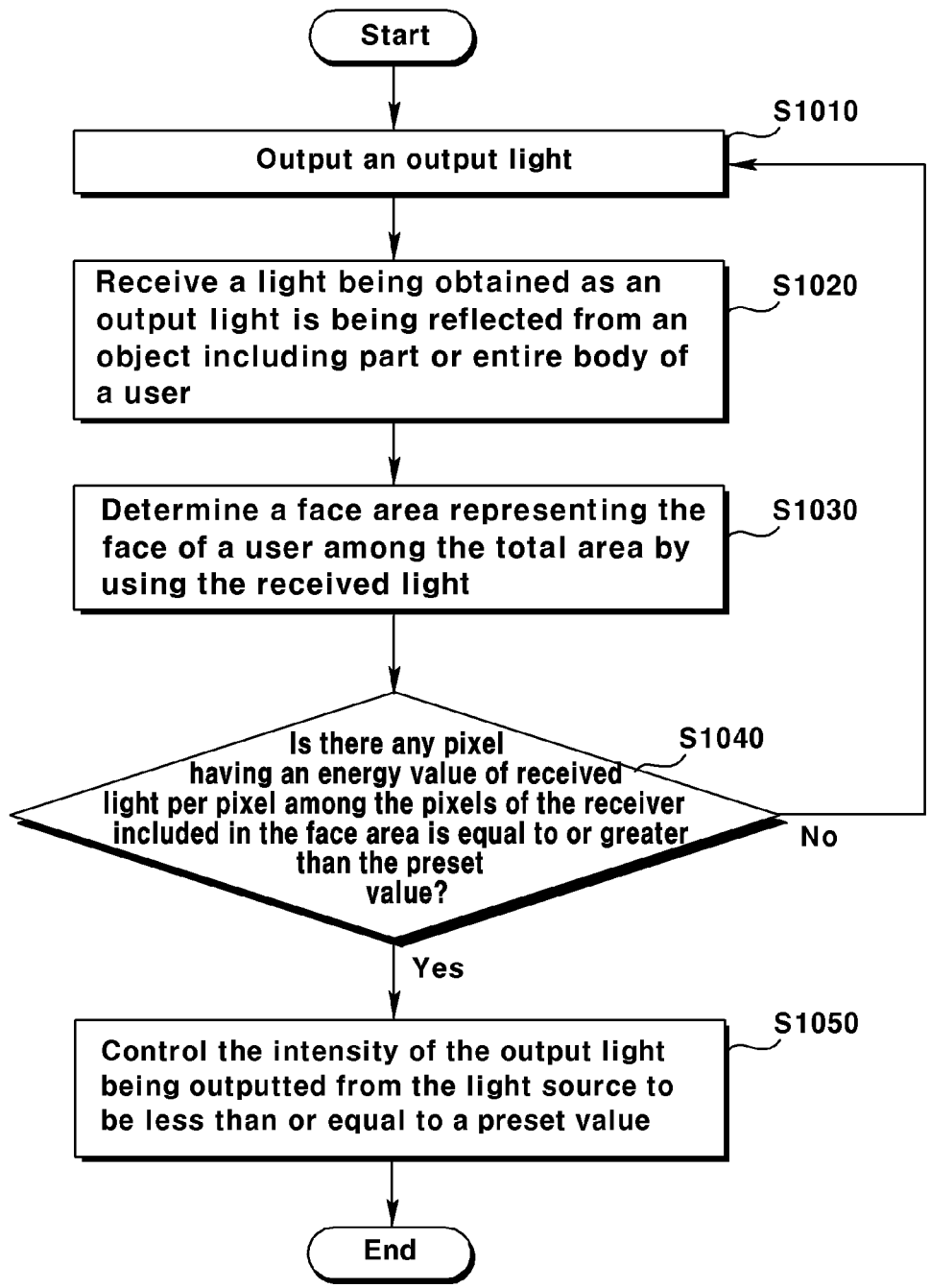
FIG. 10 is a flowchart illustrating an example in which a light outputting device controls an output of a light source according to an energy value of light being received at a pixel, according to an embodiment.

FIG. 10 is a flowchart illustrating an example according to an embodiment in which the light outputting device 100 controls an output of the light source 110 according to an energy value of light received from a pixel.

Referring to FIG. 10, a method of controlling an output by the light outputting device 100 according to an embodiment includes some of the steps illustrated in FIG. 9. Even though the contents are omitted below, the contents described above with respect to the steps illustrated in FIG. 9 may also be applied to the method of controlling the output by the light outputting device 100 of FIG. 10.

Since steps S1010 and S1020 correspond to steps S920 and S930, detailed descriptions will be omitted to simplify the overall description.

In step S1030, the light outputting device 100 according to an embodiment determines a face area representing the face of a user among the total area by using the received light.

The face area according to an embodiment may mean an area representing the face of a user among the total area, and the face area may be determined not only through an output light but also through a natural light, and the like.

In step S1040, the light outputting device 100 according to an embodiment determines whether any pixels of the receiver 120 included in the face area have the energy value of received light per pixel equal to or greater than a preset value.

The light outputting device 100 acquires received light received from a plurality of pixels included in the receiver 120 for each pixel, determines a specific area (e.g., a face area) of the object 130, determines the intensity of received light acquired from a specific area of the object 130, and may determine whether the intensity of received light acquired from a specific area of the object 130 is equal to or greater than a preset value.

The light outputting device 100 according to an embodiment determines pixels corresponding to a face area among a plurality of pixels included in the receiver 120, and may determine the current state as an abnormal state when there is a pixel among pixels of the receiver 120 included in the face area having an energy value of the received light per pixel equal to or greater than a preset value. As another example, the processor 1000 determines pixels corresponding to the face area among a plurality of pixels included in the receiver 120, and may determine the current state as an abnormal state when there are more than a preset number (e.g., two) of pixels, among the pixels of the receiver 120 included in the face area, having the energy value of the received light per pixel equal to or larger than the preset value.

The processor 1000 according to an embodiment may determine the current state as an abnormal state when the sum of the energy values of the received light received by the pixels of the receiver 120 included in the face area is equal to or greater than a preset value.

In step S1040, when the current state is determined to be an abnormal state, the light outputting device 100 proceeds to step S1050, and if the current state is determined to be a normal state, it may proceed to step S1010.

In step S1050, the light outputting device 100 according to an embodiment controls the output of the light source so that the output of the light source is less than or equal to a preset value.

When the current state is determined to be an abnormal state, the light outputting device 100 may control the intensity of the output light being outputted from the light outputting device 100 to be less than or equal to a preset value.

For example, when the current state is determined to be an abnormal state, the light outputting device 100 may turn off the output so that the output light is not outputted.

As another example, when the current state is determined to be an abnormal state, the light outputting device 100 may control the output so that the intensity of the output light is equal to or less than a preset value.

As another example, when the current state is determined to be an abnormal state, the light outputting device 100 may control the output light being outputted from the light source 110 according to the current state. For example, if there is a pixel in which the energy value of the received light per pixel is greater than or equal to a first value among the pixels of the receiver 120 included in the face area, the light outputting device 100 turns off the output so that the output light is not outputted, When there are pixels in which the energy value of the received light per pixel among the pixels of the receiver 120 included in the face area is greater than or equal to a second value (a value smaller than the first value) and less than or equal to the first value, the light outputting device 100 may control the output so that the light intensity is less than or equal to a preset value.

As another example, when the current state is determined to be an abnormal state, the light outputting device 100 may control the output light according to the sum of the energy values of the received light received by the pixels of the receiver 120 included in the face area. For example, when the sum of the energy values of the received light received by the pixels of the receiver 120 included in the face area is greater than or equal to the first value, the light outputting device 100 turns off the output so that the output light is not outputted, and when the sum of the energy values of the received light received by the pixels of the receiver 120 included in the face area is greater than or equal to the second value (a value less than the first value) and less than or equal to the first value, the light outputting device 100 may control the intensity of the output light to be less or equal to a preset value.

Meanwhile, the above-described method can be written as a program that can be executed on a computer, and can be implemented in a general-purpose digital computer that operates the program using a computer-readable recording medium. In addition, the structure of data used in the above-described method can be recorded on a computer-readable recording medium through various means. The computer-readable recording medium includes storage media such as magnetic storage media (e.g., ROM, RAM, USB, floppy disk, hard disk, etc.), optical reading media (e.g., CD-ROM, DVD, etc.).

Those of ordinary skill in the technical field related to the present embodiment will appreciate that it may be implemented in a modified form without departing from the essential characteristics of the above-described description. Therefore, the disclosed methods should be considered from an explanatory point of view rather than a limiting point of view. The scope of the present invention is presented in the claims rather than the above description, and all differences within the scope equivalent thereto should be construed as being included in the present invention.

The invention claimed is:

1. A light outputting device comprising:
a light source configured to output a light to an object;
a receiver configured to receive a light being reflected from the object;
a memory configured to store an information on a reference area of the object recognized in a normal state according to a distance between the light source and the object; and
a processor configured to control an output of the light source by comparing a recognition area of the object recognized by the receiver with the reference area,
wherein the processor controls the output of light to be inversely proportional to a size of the recognition area.

2. The light outputting device according to claim 1, wherein the processor lowers or turns off the output of the light source when a difference value between the recognition area and the reference area is greater than or equal to a preset value.

3. The light outputting device according to claim 2, wherein lowering or turning off the output of the light source is to lower or block a voltage being inputted to the light source.

4. The light outputting device according to claim 1, wherein the processor controls the output of light to be inversely proportional to a size of the recognition area when the recognition area is determined as a first section, and the processor turns off the output of the light source when the recognition area is determined as a second section.

5. The light outputting device according to claim 4, wherein the recognition area is determined as the first section when the recognition area is 50% to 90% of the reference area.

6. The light outputting device according to claim 4, wherein the recognition area is determined as the second section when the recognition area is 0% to 50% of the reference area.

7. The light outputting device according to claim 1, wherein the information on the reference area stored in the memory is an information on an area corresponding to each of a plurality of distances in the form of a look-up table (LUT).

8. A method for controlling a light outputting device, the method comprising:
outputting a light to an object;
receiving a light being reflected from the object;
storing an information on a reference area of the object recognized in a normal state according to a distance from which the light is reflected from the object and received; and
comparing a recognition area of the object recognized by the light being received and the reference area, and lowering or blocking an output of the light when the recognition area is less than or equal to a preset value than the reference area,
wherein the step of lowering or blocking comprises controlling the output of light to be inversely proportional to a size of the recognition area.

9. The method for controlling a light outputting device according to claim 8, wherein the step of lowering or blocking comprises lowering or turning off when a difference value between the recognition area and the reference area is greater than or equal to a preset value.

10. The method for controlling a light outputting device according to claim 9, wherein lowering or turning off the output of the light source is to lower or block a voltage being inputted to the light source.

11. The method for controlling a light outputting device according to claim 8, wherein the step of lowering or blocking comprises controlling the output of light to be inversely proportional to a size of the recognition area when the recognition area is determined as a first section, and turning off the output of the light source when the recognition area is determined as a second section.

12. The method for controlling a light outputting device according to claim 11, wherein the recognition area is determined as the first section when the recognition area is 50% to 90% of the reference area, and is determined as the second section when the recognition area is 0% to 50% of the reference area.

* * * * *